United States Patent
Behrendt et al.

(10) Patent No.: US 8,381,221 B2
(45) Date of Patent: Feb. 19, 2013

(54) DYNAMIC HEAT AND POWER OPTIMIZATION OF RESOURCE POOLS

(75) Inventors: Michael Behrendt, Randersacker (DE);
Andreas Bieswanger, Ehningen (DE);
Gerd Breiter, Wildberg (DE);
Hans-Deiter Wehle, Horb Talheim (DE)

(73) Assignee: International Business Machines Corporation, Armonk, NY (US)

( * ) Notice: Subject to any disclaimer, the term of this patent is extended or adjusted under 35 U.S.C. 154(b) by 1023 days.

(21) Appl. No.: 12/396,630

(22) Filed: Mar. 3, 2009

(65) Prior Publication Data
US 2009/0228893 A1  Sep. 10, 2009

(30) Foreign Application Priority Data
Mar. 4, 2008 (EP) .................................... 08152235

(51) Int. Cl.
*G06F 9/46* (2006.01)
(52) U.S. Cl. ....................................................... 718/104
(58) Field of Classification Search .................. None
See application file for complete search history.

(56) References Cited

U.S. PATENT DOCUMENTS

| 7,447,920 B2 * | 11/2008 | Sharma et al. ................ 713/300 |
| 2006/0112286 A1 | 5/2006 | Whalley et al. |
| 2009/0106571 A1 * | 4/2009 | Low et al. .................... 713/310 |

OTHER PUBLICATIONS

Heo et al., "Reducing Power Density through Activity Migration", 2003, ISLPED'03.*

* cited by examiner

*Primary Examiner* — Eddie P Chan
*Assistant Examiner* — John Lindlof
(74) *Attorney, Agent, or Firm* — D'Ambrosio & Menon, PLLC; Usha Henon; Gabriel Gonzàlez (57) ABSTRACT

Method, computer program products and systems for conserving energy in data processing center, wherein a plurality of services are offered to a plurality of subscribed service consumers in a dynamic fashion, allowing a created service instance to be re-assigned from one to another server of the resources. Control parameters comprising power consumption and temperature of a group of resources are monitored. A workload may be assigned properties such as "hot" and "cold." which are then assessed. A hot workload may be relocated to a cold spot, and if necessary, a cold workload may be relocated to a location which was de-loaded from a workload, that is, a hot spot, which is then considered to cool down due to addition of less workload in form of the cold workload. Thus, the energy required to cool the data center may be minimized.

15 Claims, 6 Drawing Sheets

DYNAMIC HEAT AND POWER OPTIMIZATION OF RESOURCE POOLS

This application is based on and claims the benefit of priority from European Patent Application EP08152235.1 filed Mar. 4, 2008.

BACKGROUND

Growing concerns on the effects of global warming have ignited renewed interest among the business community to assess and take actions on improving energy conservation. Designing energy efficient solutions has recently become an important concern to make these environments economically attractive for many data center environments.

SUMMARY

Embodiments of the invention determine "hot spots" or heated locations and "cold spots" or cold locations in data centers. The workload may also be assessed, by assigning to one or more service instances properties, such as, "hot" and "cold." A hot workload may be relocated to a cold spot, and if necessary, a cold workload may be relocated to a location which was de-loaded from some workload, i.e. a hot spot, which is then considered to cool down due to addition of less workload in the form of a cold workload. Thus, the energy required to cool the data center can be minimized. The same control can be applied for consolidation purposes.

According to one embodiment of the invention, a method for conserving energy at a data center comprises controlling at least one of server resources, storage resources, network resources and application resources of an electronic data processing center in an energy-efficient way, wherein a plurality of services are offered to a plurality of subscribed service consumers in a dynamic fashion, allowing a created service instance to be re-assigned from one to another server of the resources, in which method power consumption and temperature of a locally and physically limited group of resources are monitored.

The method includes repeatedly, or continuously, monitoring and determining "locations" of resource groups—generally a plurality of resources, e.g. server or other hardware/software resources hosted for example in a certain location in the data center, such as for example arranged on a single server rack, or the like—in the data center having a temperature higher than a first predetermined threshold temperature (e.g. 40° C.)—herein referred to as hot location—and resource groups in the data center having a temperature lower than a predetermined threshold temperature, (e.g. 25° C.)— cold location, respectively: determining for a created service instance its instance specific workload fraction from one or more of measurable technical parameters such as CPU-MIPS consumption, frequency of cache hits and misses, frequency of disk accesses, network load, memory consumption and memory bandwidth; repeatedly or continuously calculating from the workload fraction a workload energy index by defining a relation between the service instance specific workload fraction and the total power consumption and temperature of the server hosting the specific service instance.

The workload energy index of a service instance ("WEI") may be defined in dependence, i.e. as a function, of one or more technical parameters, as WEI(instance) $f(b1,b2,b3,b4,b5,b6)$. The method further includes repeatedly or continuously monitoring and determining service instances being run on the resources in the data center having a workload index higher than a predetermined threshold—herein referred to as "hot service instance"—and service instances being run on the resources in the data center having a workload index lower than a predetermined threshold thus yielding a respective cold service instance; determining a relocation trigger event saying that a relocation of one or more service instances is useful for lowering the temperature of a server location, and thus useful for saving cooling energy and, in case a trigger event has occurred, initiating one or more actions of relocating a hot service instance to a cold location or relocating a cold service instance to a hot location, if a hot service instance has been relocated away from the hot location.

Cache misses may cool the workload, while cache hits may lead to higher energy consumption of the processors, thus making the workload hot. Similarly, the more memory accesses per time slice performed, the more memory may be consumed, thus making the location hotter. The hot spots in a data center may be caused by a server location running under a high workload. This hot spot may then have to be intensively cooled, thereby consuming a large amount of electrical energy. In one embodiment of the invention, the hot spots may be removed and thus, the requirement for a large amount of energy for cooling the hot spot may be avoided. Hot spot removal may be accomplished by taking away a service instance from a hot location. Hot spot removal may also be accomplished by interchanging service instances, or just workload between locations.

In one embodiment, instead of a single service instance, when the individual service instances have only a small impact on power consumption, a plurality of service instances may be subjected to a single workload energy index calculation, and in case a trigger event has occurred, the plurality of service instances may be relocated more or less concurrently.

In yet another embodiment, if a determination is made that one or more service instances may be relocated to a different server location in case an entire location is switched off and the server location hosting the relocated instances is expected to stay below a predetermined "useful" power consumption level, the workload caused by the service instances can be consolidated such that the number of server locations under operation can be optimized.

For example, if there are ten locations side by side in a data center, and all these locations are operated for performing some workload under an optimal usage of, say, 80% of their maximum capacity, their energy saving performance may be better compared to a situation where the same workload is distributed on two hundred server locations, and where the two hundred locations must then be cooled.

In one embodiment of the invention, a power and heat driven control method for managing resources of a dynamic IT environment is disclosed. The respective logic to handle power and heat issues may also be implemented.

According to another embodiment of the invention, a Heat and Power Management Service (HPMS) is disclosed as a technical control method providing a specific, integrated implementation for dynamically allocating and interchanging IT resources, based on energy consumption, heat dissipation measurements and evaluation, and based on a workload energy index calculation for one or more of above mentioned service instances. By monitoring key parameters, as they are given, to calculate the workload energy indexes, the HPMS may be used to interchange workloads to underutilized ("cooler") or more energy-efficient resources.

In order to trigger shutdown or startup of dynamic IT resources/services based on energy consumption, heat dissipation and a workload energy index, the HPMS may rationally consolidate or distribute energy-related workloads. Thus, its capabilities for dynamic allocation may respond by "scaling up" or "scaling out" workloads, depending on the specific situation or the workload energy index. The range of these activities can be a single server or a huge agglomeration of them. i.e. an entire "IT landscape".

According to an embodiment of the invention, a workload consolidation instructions is disclosed which may minimize data center energy consumption by consolidating all available workload in a "scaled up" environment. Resources that are not required may be put into a power saving mode (which may also include powering off the resource). The individual energy efficiency of servers may also be taken into account.

Embodiments of the present invention may thus be capable of optimizing the available resources in a data center by eliminating hotspots through interchanging "hot" and "cool" locations, while maintaining a minimal footprint of required servers and thus, minimizing the energy demand.

Implementations of the method discussed above may include a computer-implemented method, a system, or a computer program product. The details of one or more embodiments of the invention are set forth in the accompanying drawings and the description below. Other features of the invention will be apparent from the description and drawings, and from the claims.

DETAILED DESCRIPTION

Exemplary methods, systems, and computer program products for conserving energy at a data center are described with reference to the accompanying drawings. The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising." when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention and the practical application, and to enable others of ordinary skill in the art to understand the invention for various embodiments with various modifications as are suited to the particular use contemplated.

Figure 1:
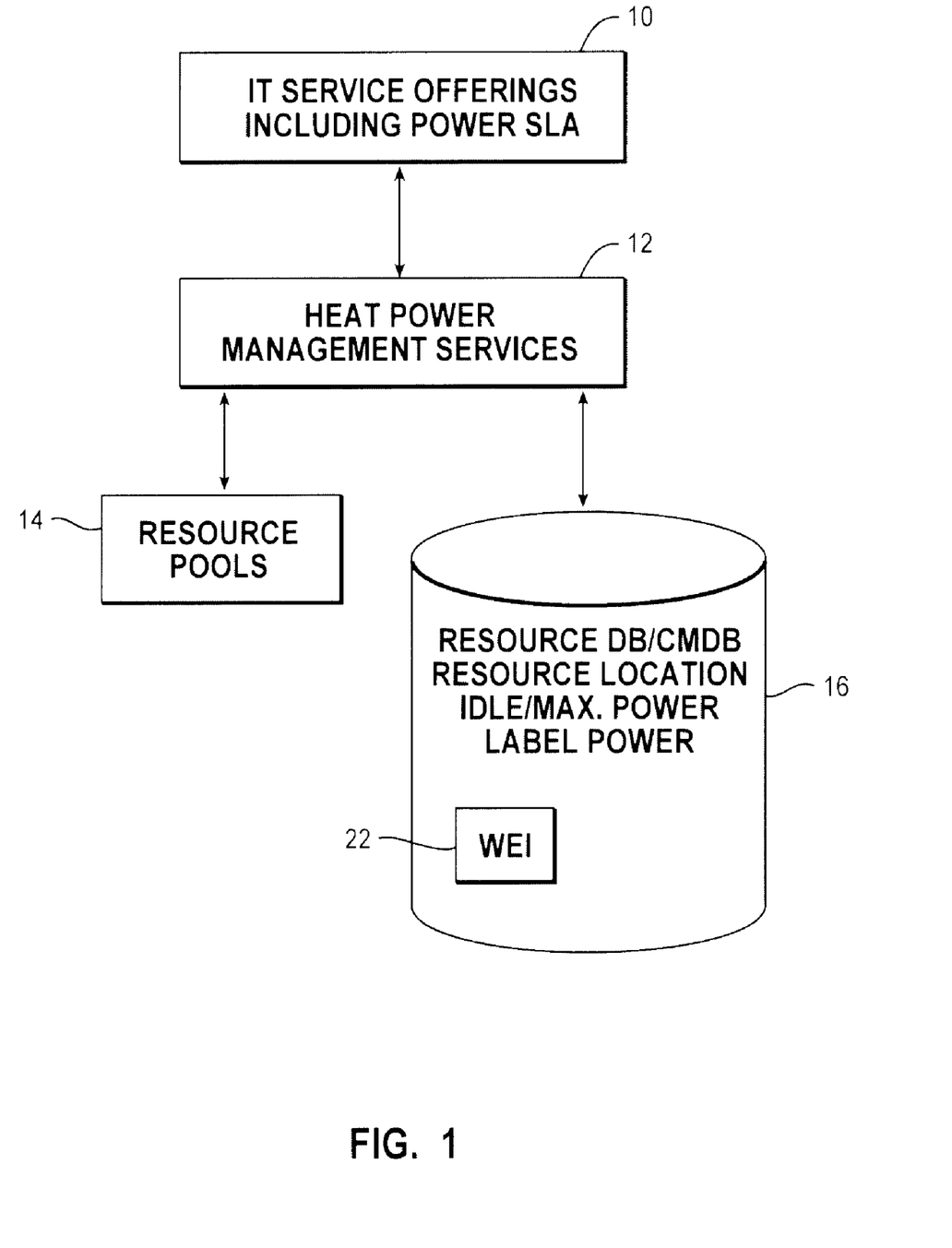
FIG. 1 illustrates the structural components of the hardware and software environment in accordance with one embodiment of the invention.

With general reference to the figures and with special reference now to FIG. 1. a control parameter is disclosed. This parameter is referred to herein as workload energy index, and abbreviated as WEI. This control parameter WEI may be used during evaluation and control of relocating software instances.

The power consumption and ambient temperature of the above mentioned server locations is determined. According to this embodiment of the invention, the WEI may be defined and calculated for all running service instances in order to determine a respective number of fractions of (instance specific workload)/(overall workload) where WEI(instance)=f (b1,b2.b3.b4.b5. b6), by including all of the following instance-specific parameters such as, CPU-MIPS consumption, frequency of cache hits and misses, accesses, frequency of disk accesses, network load, memory consumption, and memory bandwidth. From a subsequent evaluation thereof, new relocations of service instances may be initiated and performed.

In a non-virtualized box, the WEI may be created by querying the system's total power consumption and ambient temperature. With this, the heat load of the system may be determined. In a virtualized box, the WEI of a single workload—a single service instance or a plurality of instances—needs to take into account how much the workload of this single service instance contributes to the overall energy consumption of that system or systems. This means that the resource demand of a service instance will be compared to the overall capacity of the system and a proportional value will be calculated. The WEI may need to be determined on a regularly repeated basis, as it can vary over time.

The WEI may be calculated from service instance specific values comprising CPU-MIPS consumption, frequency of cache accesses, frequency of disk accesses, network load, memory consumption, power consumption, and optionally, ambient temperature. These values can be read from built-in Power Management systems, Systems Management and a Location Manager database.

An exemplary WEI-sample calculation may be carried out as follows, with weighting factors taken with some degree of arbitrariness:

CPU-MIPS consumption×factor 200;
frequency of cache misses×factor 80;
frequency of disk accesses×factor 50;
network load×factor 20:
memory consumption×factor 100;
power consumption×factor 600 (determining factor); and
ambient temperature×factor 500 (determining factor)

$b_i=1$(loading value)

Workload energy index, $WEI=b_i(b1+b2+b3+b4+b5+b6+b7)=1550$

After the WEI for a given service instance is calculated, it may be determined whether the workload energy index of the dynamic IT service (DITS) is greater than a predetermined threshold for a predetermined duration of, say. n seconds. If the threshold is 1000. and the WEI exceeds 1000 for an adequately predetermined duration longer than n seconds, then a case of "hot workload" is defined for a given service instance.

In one embodiment of the invention, the method then looks for a "cold workload," using the HPMS location manager database to identify the current workload energy index of each system of the whole data center. If the service instance is running on a single system in a single location, the workload energy index WEI is also related to this system.

If a dynamic IT service (DITS) instance (cold workload) is found, and its WEI is smaller than a given second threshold and well below the WEI of the hot workload, e.g., 300, and if the cold workload is comparable in the resource allocation requirements with that of the hot workload, and the maximum free resources on both locations are not exceeded, then the location of the hot workload is interchanged with the location of the cold workload.

Having calculated the service instance related WEI, the embodiment of the invention may be run for example, for removing hotspots in the datacenter by interchanging cold workload and hot workload such that cold workload is relocated to currently hot locations, and if necessary hot workload is relocated to cold locations.

Figure 2:
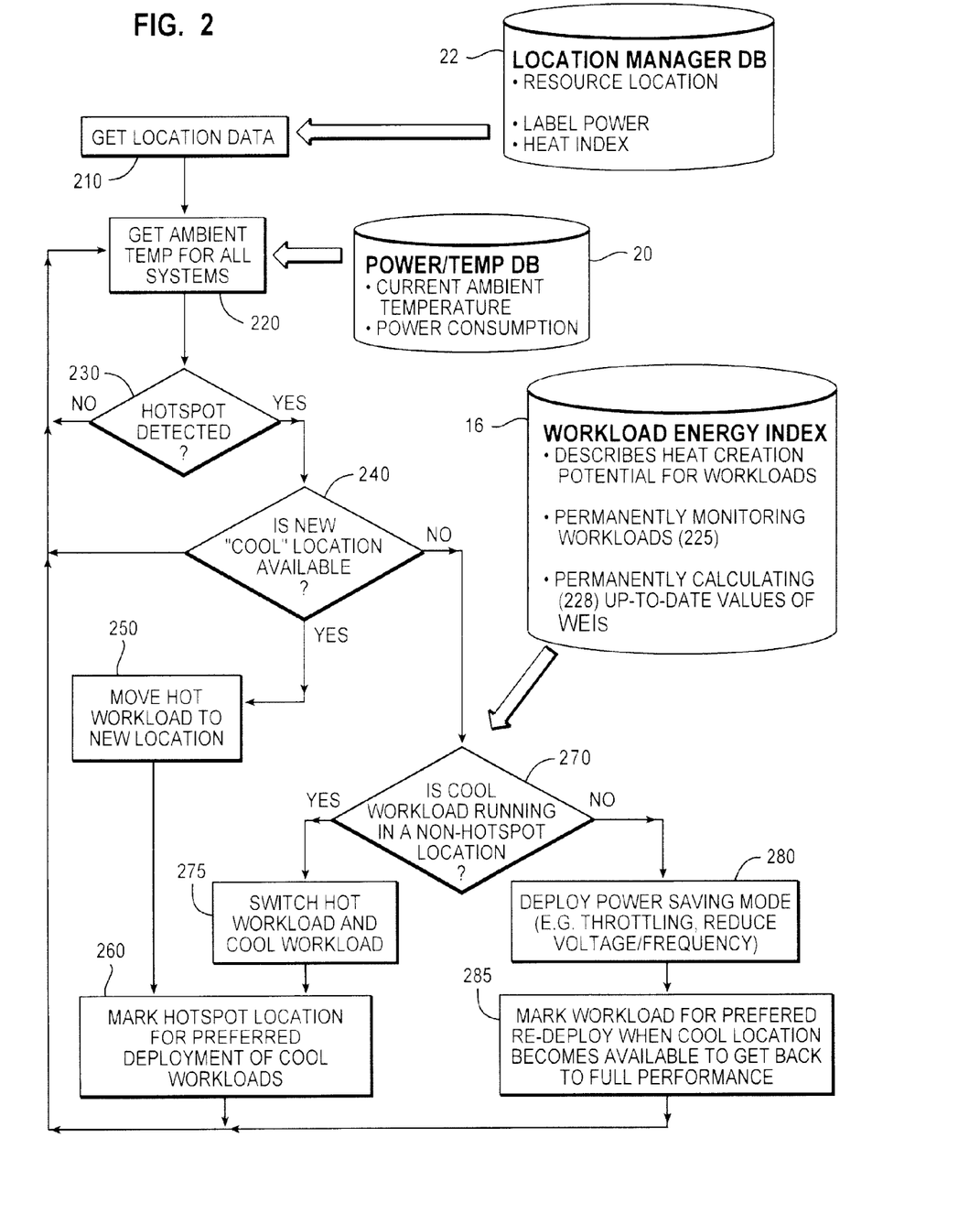
FIG. 2 illustrates the hot spot removal control flow in accordance with one embodiment of the invention.

FIG. 2 illustrates the hot spot removal control flow in accordance to one embodiment of the invention. With reference now to FIG. 2. in a first step 210 the control instructions read the location data of the system. This is, for example, the coordinates of the server rack and the position within the server rack. See also figure box 48 in FIG. 4.

In a next step 220 the ambient temperature is read for all server systems. If a single location hosts, for example, thirty servers in a single server rack, the ambient temperature of each location can be measured and evaluated. In a next check step 230 it is determined if a hotspot does exist. A hotspot will be detected, when the temperature measured at some given location is greater than the threshold temperature value, e.g. higher than 35° C. 40° C., etc. dependent of the local conditions, and where exactly the temperature is sensed. Alternatively, a hot spot is detected, if the WEI of a certain location is higher than a certain predetermined threshold.

In the NO-case, it is branched back to step 220. In the YES-case, the control instructions perform a test 240 for testing if a cool location, for example, lower than 25° C., 20° C., etc. similarly dependent, as discussed above, is available in order to relocate some workload, i.e. a single or a plurality of service instances from the detected hotspot to the cool location. In the YES-branch of step 240 the workload is basically moved to the new location, which will lower the power consumption and thus the temperature at the hotspot. Then, in a next step 260 this detected hotspot from step 230 is marked as a location for occurrence of hotspots and thus for a deployment of cool workloads. Then the control is again fed back to step 220.

In the NO-branch of step 240, no "cool location" is available. Then, and with particular focus of the control flow, in a step 270, a test is performed for checking if a cool workload is currently running in a location which is currently not detected as a "hotspot location."

The attribute "cool" for defining a cool workload or a cool service instance is calculated as demonstrated above, and includes accessing a database, for example the database 16 shown in FIG. 1. wherein data which describes the heat creation potential for workloads is stored.

In the YES-branch of step 270, the hotspot detected in step 230 may reveal some "hot workload". In step 270, a cool workload is found. So, according to one embodiment of the invention, in the YES-branch of step 270, it is decided to switch the hot workload and the cool workload. This is done just by relocating the hot workload to the cool location and relocating the cool workload to the hot location. This may be done if there is basically no capacity for relocating the hot workload on a server, which is basically in an idle state or which has at least significant capacity reserves. After step 275, control is forwarded to step 260.

The implementation of the NO-branch of step 270 can be done in various ways. No cool workload is found running in a non-hotspot location. In other words, either there is no cool workload existing in the datacenter, or there is some cool workload, but the datacenter is full of hotspots.

In this case, in a further step 280, a power saving mode is deployed, for example by throttling, or reducing the voltage or the frequency of the processors technical means adapted to the current situation. The consequence of step 280 is that the power consumption may decrease and so also, after some time, the temperature may also decrease.

In a further step 285, the workload of the dynamic IT service is marked for redeployment, when, at some later point in time, a cool location becomes available. By that, it is possible to switch back the power saving mode to a full performance mode. After step 285 control is fed back to step 220.

The current measurement values of ambient temperature and power consumption may be managed and stored in a respective database 20. The HPMS location database 16 extracts the system values from the power management and system management tools and extends these data by the location data, for example, the location in the data center, by policy values etc., and creates a new database.

The location values can be read from the location manager database. All current environment and location values are stored in this database 16 and will be refreshed after predetermined refresh interval.

Figure 3:
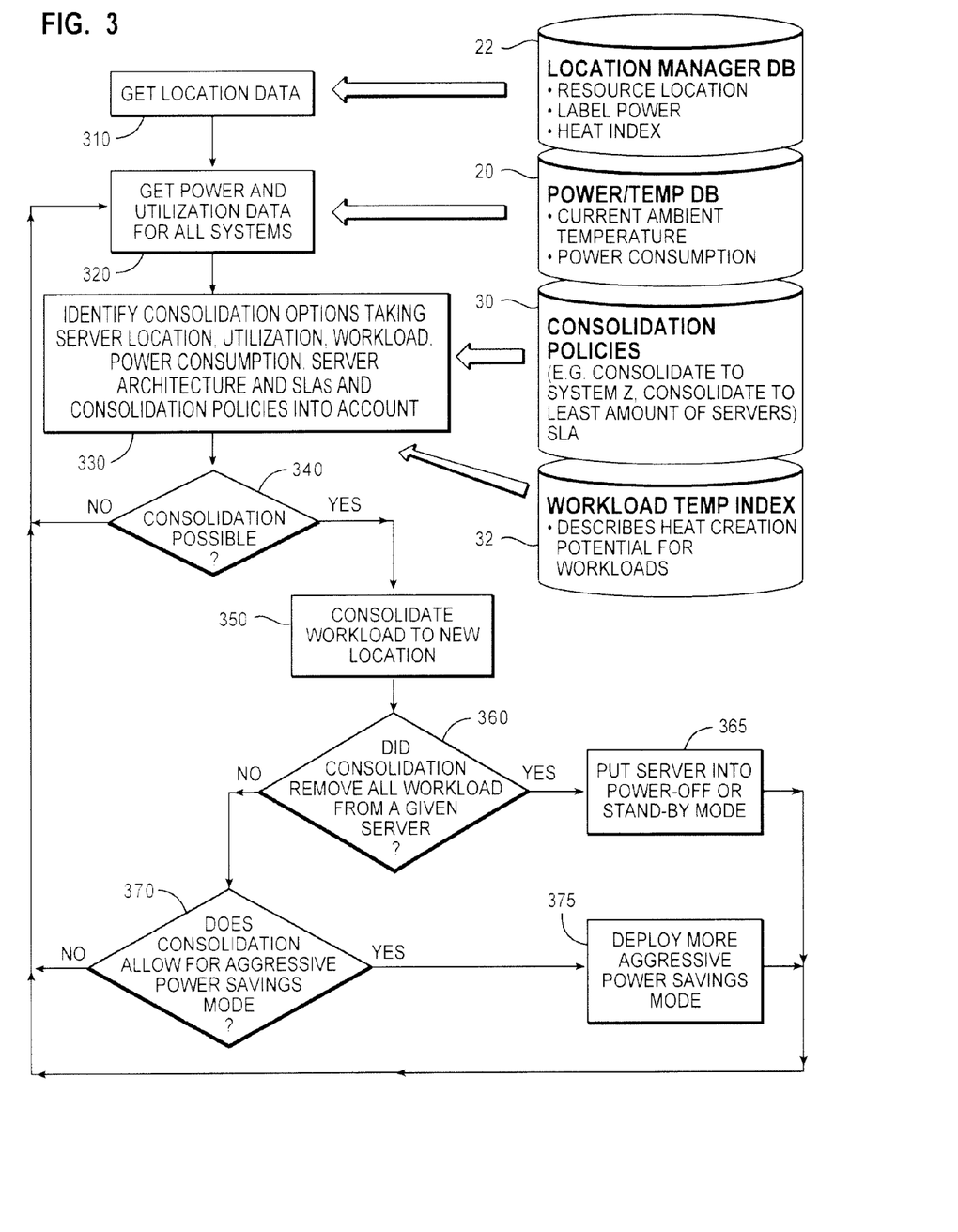
FIG. 3 illustrates the workload consolidation control flow in accordance with one embodiment of the invention.

With reference now to FIG. 3, in a first step 310, the location data is received from the HPMS location manager database, see the arrow from location manager database 22. In a next step 320 the power and utilization data for all systems in the data center is received from the system management environment, see database 20, and HPMS location manager database 22.

In a next step 330, the controller may identify or determine if a consolidation 'scale-up' is possible to reduce the power consumption. For example, all necessary values will received from the different management tools and/or databases, the location manager database 22, a Power/Temperature Database 20, a consolidation policy database 30 for reading the "rules" for the current consolidation process and a workload energy index database 32.

In a first check step 340, it is determined if a consolidation case does exist, i.e., if it is useful to consolidate. A consolidation case will be recognized to be useful, when the overall WEI of the data center, after consolidation has a less threshold, or has smaller energy consumption.

In the NO-case, it is branched back to step 320. In the YES-case of step 340, the one or more DIPS will consolidate to a new location, for example, to a backend server with a lower utilization over the weekend.

In the next check step 360, it is determined if all running workload has been moved from the server. In the NO-case. it is branched to step 370. In the YES-case of step 360, it is branched to step 365.

Then, in a next step 365 the server which was "de-loaded" from workload will be put in into a power off or stand-by mode to save energy. In next check step 370. it is determined if it is possible to enter the systems or some of them into an aggressive power saving modes, i.e., for example to reduce the power consumption to a lower value.

In the NO-case. it is branched back to step 320. In the YES-case of step 370, the power capping mode for the server may be deployed. Control is fed back to step 320.

Figure 4:
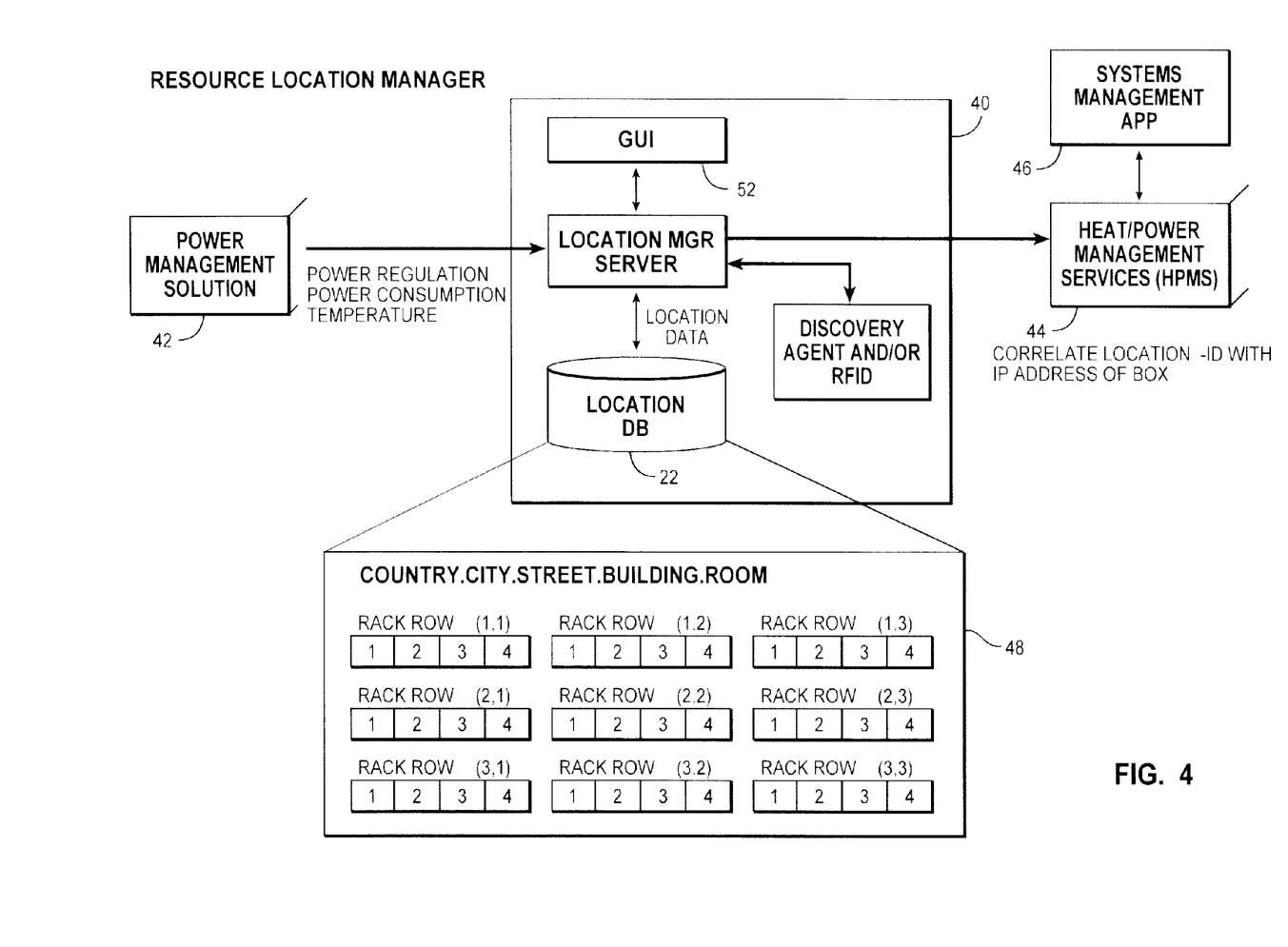
FIG. 4 illustrates a schematic overview on a resource location manager used in one embodiment of the invention.

FIG. 4 illustrates the HPMS resource location manager 40 and the interaction to power management solution component 42 and to system management tools 44. With reference now to FIG. 4. in a first step the HPMS resource location manager receives a power regulation parameter. The power regulation parameter includes the minimum and maximum values of a predetermined power capping range.

Further, it receives the ambient temperature, and power consumption values from the discovered server. The discovery procedure uses agents existing basically in prior art from system management tools 46 or RFID technology.

In a next step the discovered system data will be extended by the data describing location values such as depicted in the database scheme 48, namely Country. City. Street, Building, Room, Row, column via the user interface of HPMS. see the GUI 52.

Then, in a next step HPMS will calculate the workload energy index and store the values at resource location manager database every refresh cycle. The refresh cycle time is preset to an adequate value.

In a next step, the embodiment of the method identifies the situation of the server in relation to the current status of the server's WEI.

All steps relevant herefore are already described with reference to FIGS. 2 and 3 above.

Figure 5:
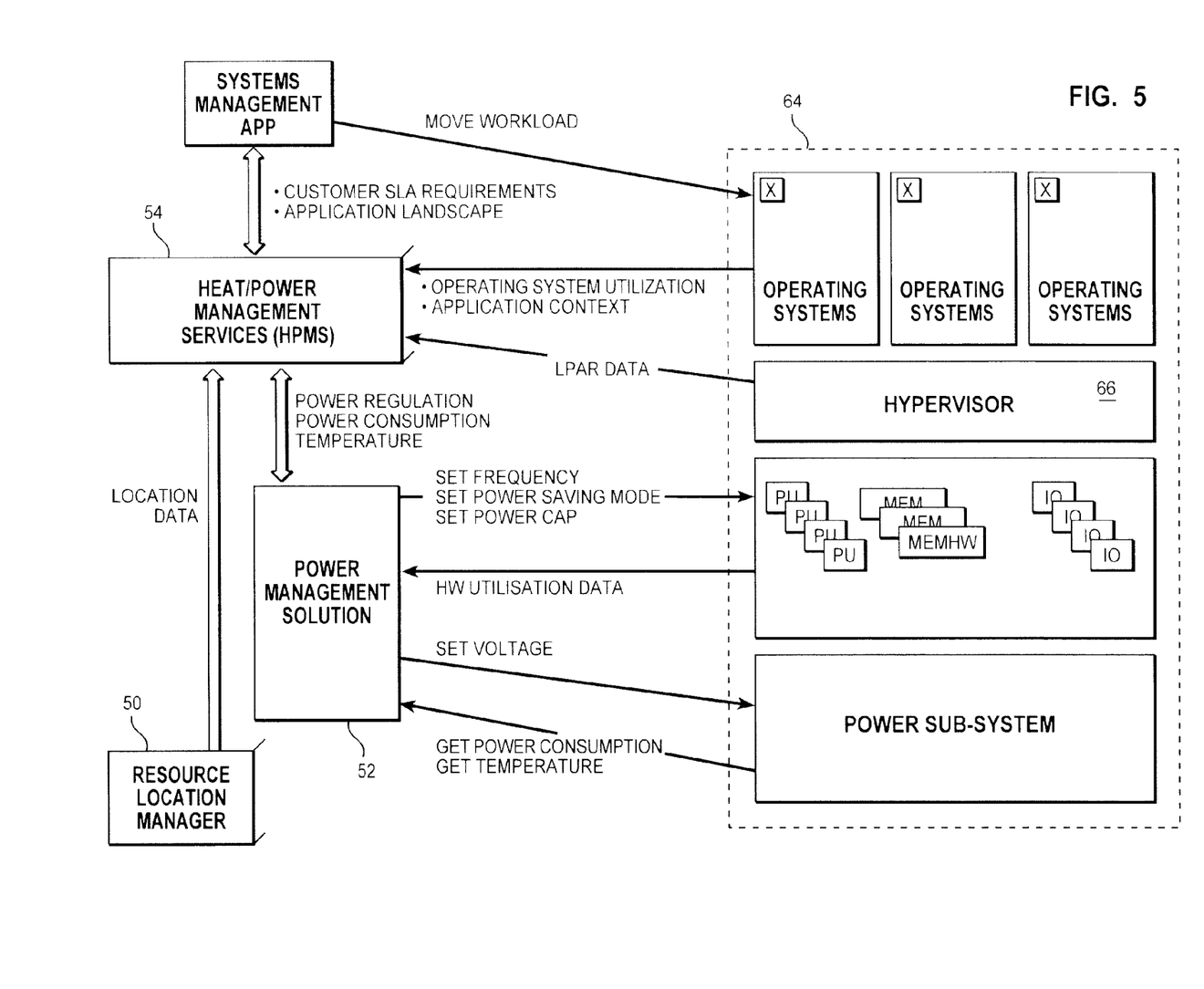
FIG. 5 is a schematic system view on managing a virtualized environment in accordance with one embodiment of the invention.

FIG. 5 illustrates an embodiment of the heat and power management method in form of a service (HPMS) symbolized by box 54 from a virtualized 'single' box view.

With reference to FIG. 5. in a first step. HPMS 54 and HPMS location manager 50 monitor the virtualized system comprised of broken line frame 64. In more detail, the HPMS receives from the power management solution program 52 the power and temperature information from a hypervisor 66. and from the operating system the HPMS gets logical partition (LPAR) data, application context and system utilization values.

An LPAR is a subset of the processor hardware that is defined to support an operating system. An LPAR contains resources (processors, memory, and input/output devices) and operates as an independent system. Multiple logical partitions may also exist within a mainframe hardware system.

In a next step, the HPMS 54 calculates the WEI for this virtualized system and compares it to the data prescribed by a Service Level Agreement (SEA) and/or to threshold value to decide. if a hot spot has occurred. The difference to a non-virtualized system is that HPMS 54 has to include the virtualized surrounding into its calculation.

Figure 6:
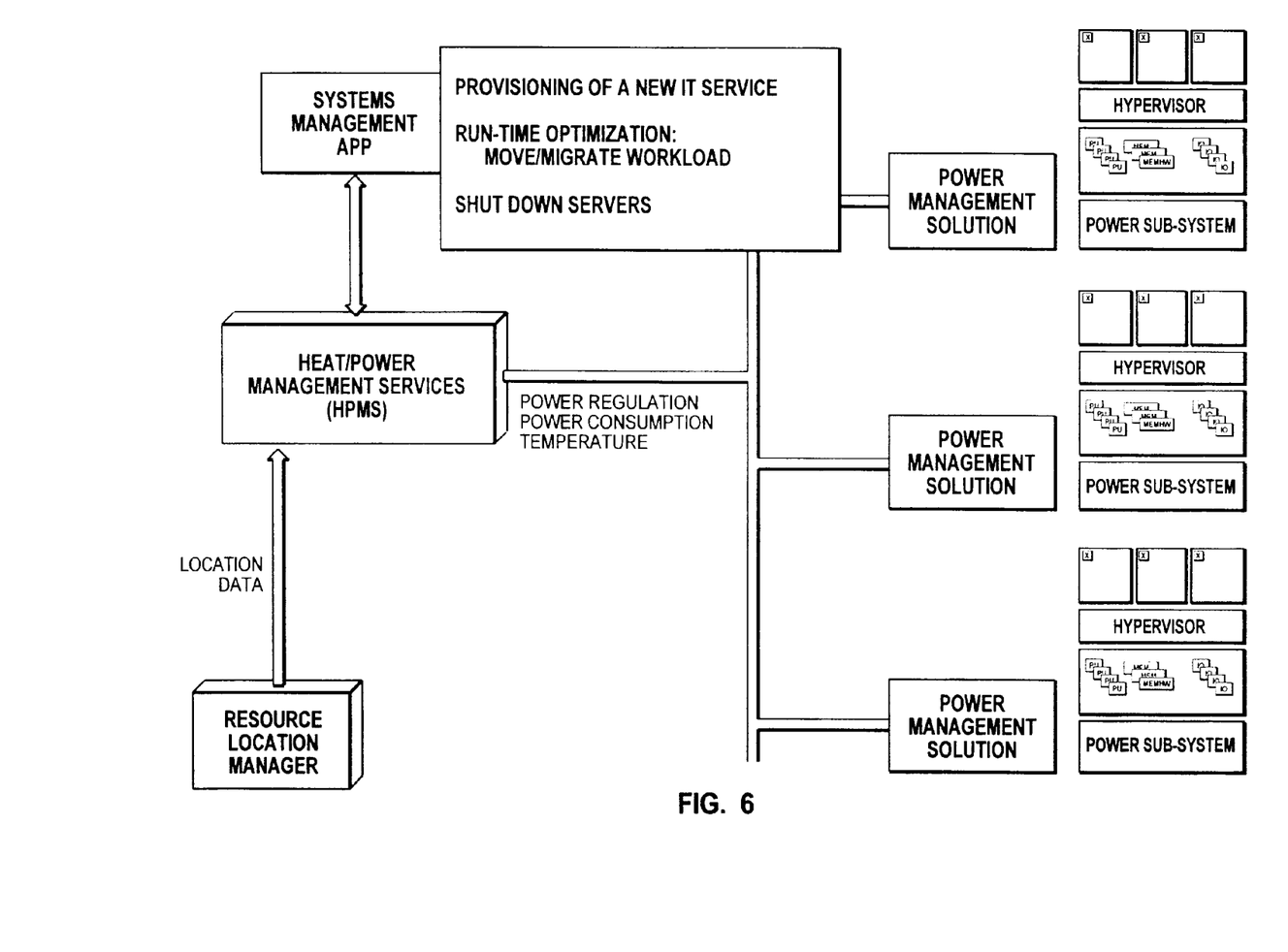
FIG. 6 is a schematic datacenter view illustrating management of a virtualized environment in accordance with one embodiment of the invention.

FIG. 5 illustrates the HPMS 54 from a data center point of view. The process described in FIG. 5 may be applied to a plurality of systems that compromise a sub-set of, or an entire data center. The difference with FIG. 6 shows that it is not enough to manage energy on box-level. Instead, it is important to consider the whole data center. In other words, it is important to have a holistic view.

Embodiments of the invention may take the form of an entirely hardware embodiment, an entirely software embodiment or an embodiment containing both hardware and software elements. In one embodiment, the invention is implemented as a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

It should also be understood that the inventive concepts disclosed herein are capable of many modifications. To the extent such modifications fall within the scope of the appended claims and their equivalents, they are intended to be covered by this patent.

The invention claimed is:

1. A computer implemented method for conserving energy at a data center comprising:

repeatedly monitoring power consumption and temperature of a locally and physically limited group of resources, wherein the resources comprise at least one of server resources, storage resources, network resources, or application resources;

determining one or more hot locations in the resource group having a temperature higher than a predetermined first threshold temperature;

determining one or more cold locations in the resource group having a temperature lower than a predetermined second threshold temperature;

repeatedly monitoring an instance specific workload fraction for a created service instance using one or more measurable technical parameters, the one or more measurable technical parameters comprising: CPU-MIPS consumption, frequency of cache hits and misses, frequency of disk accesses, network load, memory consumption, and memory bandwidth;

repeatedly calculating a workload energy index (WEI) for the created service instance, the WEI describing heat creation potential for the service instance workload, calculating the WEI comprising defining a relation among service instance specific values, the service instance specific values comprising: the service instance specific workload fraction, and the total power consumption of one or more resources hosting the specific service instance;

repeatedly monitoring and determining hot service instance workloads being run on the resources in the data center, the hot service instance workloads having a WEI higher than a predetermined first threshold WEI;

repeatedly monitoring and determining cold service instance workloads being run on the resources in the data center, the cold service instance workloads having a WEI lower than a predetermined second threshold WEI;

determining a relocation trigger event in dependence of the first and second threshold temperatures and the first and second threshold WEIs, the event having the functional meaning that a relocation of one or more service instance workloads is useful for lowering the temperature of a resource location; and in response to an occurrence of the relocation trigger event, initiating at least one of: a relocation of a hot service instance workload to a cold location, and a relocation of a cold service instance workload to a hot location, wherein relocation of a service instance workload does not exceed the maximum available resources of the location to which the service instance workload is relocated.

2. The method of claim 1, further comprising offering a plurality of services to a plurality of subscribed service consumers in a dynamic fashion.

3. The method of claim 1, further comprising allowing the created service instance to be re-assigned from one resource server to another resource server.

4. The method of claim 1, comprising subjecting a plurality of service instance workloads to a single WEI calculation, wherein the plurality of service instance workloads are relocated concurrently when a trigger event occurs.

5. The method of claim 1, further comprising determining if one or more service instance workloads can be relocated from a first resource location to a second resource location if the first resource location is switched off and the second resource location is expected to stay below a predetermined useful power consumption level.

6. A computer program product for conserving energy at a data center comprising:

a non-transitory computer-usable medium including:

computer program instructions for repeatedly monitoring power consumption and temperature of a locally and physically limited group of resources, wherein the resources comprise at least one of server resources, storage resources, network resources, or application resources;

computer program instructions for determining one or more hot locations in the resource group having a temperature higher than a predetermined first threshold temperature;

computer program instructions for determining one or more cold locations in the resource group having a temperature lower than a predetermined second threshold temperature;

computer program instructions for repeatedly monitoring an instance specific workload fraction for a created service instance using one or more measurable technical parameters, the one or more measurable technical parameters comprising: CPU-MIPS consumption, frequency of cache hits and misses, frequency of disk accesses, network load, memory consumption, and memory bandwidth;

computer program instructions for repeatedly calculating a workload energy index (WEI), the WEI describing heat creation potential for the service instance workload, calculating the WEI comprising defining a relation among service instance specific values, the service instance specific values comprising: the service instance specific workload fraction, and the total power consumption of one or more resources hosting the specific service instance;

computer program instructions for repeatedly monitoring and determining hot service instance workloads being run on the resources in the data center, the hot service instance workloads having a WEI higher than a predetermined first threshold WEI;

computer program instructions for repeatedly monitoring and determining cold service instance workloads being run on the resources in the data center, the cold service instance workloads having a WEI lower than a predetermined second threshold WEI;

computer program instructions for determining a relocation trigger event in dependence of the first and second threshold temperatures and the first and second threshold WEIs, the event having the functional meaning that a relocation of one or more service instance workloads is useful for lowering the temperature of a resource location and computer program instructions for initiating at least one of: a relocation of a hot service instance workload to a cold location, and a relocation of a cold service instance workload to a hot location, wherein relocation of a service instance workload does not exceed the maximum available resources of the location to which the service instance workload is relocated, the relocation initiated in response to an occurrence of the relocation trigger event.

7. The computer program product of claim 6, wherein the non-transitory computer-usable medium includes computer program instructions for offering a plurality of services to a plurality of subscribed service consumers in a dynamic fashion.

8. The computer program product of claim 6, wherein the non-transitory computer-usable medium includes computer program instructions for allowing the created service instance to be re-assigned from one resource server to another resource server.

9. The computer program product of claim 6, wherein the non-transitory computer-usable medium includes computer program instructions for subjecting a plurality of service instance workloads to a single WEI calculation, wherein the plurality of service instance workloads are relocated concurrently when a trigger event occurs.

10. The computer program product of claim 6, wherein the non-transitory computer-usable medium includes computer program instructions for determining if one or more service instance workloads can be relocated from a first resource location to a second resource location if the first resource location is switched off and the second resource location is expected to stay below a predetermined useful power consumption level.

11. A system for conserving energy at a data center comprising:

a processor; and a computer memory operatively coupled to the processor, wherein the computer memory has disposed within it:

computer program instructions for repeatedly monitoring power consumption and temperature of a locally and physically limited group of resources, wherein the resources comprise at least one of server resources, storage resources, network resources, or application resources;

computer program instructions for determining one or more hot locations in the resource group having a temperature higher than a predetermined first threshold temperature;

computer program instructions for determining one or more cold locations in the resource group having a temperature lower than a predetermined second threshold temperature;

computer program instructions for repeatedly monitoring an instance specific workload fraction for a created service instance using one or more measurable technical parameters, the one or more measurable technical parameters comprising: CPU-MIPS consumption, frequency of cache hits and misses, frequency of disk accesses, network load, memory consumption, and memory bandwidth;

computer program instructions for repeatedly calculating a workload energy index (WEI), the WEI describing heat creation potential for the service instance workload, calculating the WEI comprising defining a relation among service instance specific values, the service instance specific values comprising: the service instance specific workload fraction, and the total power consumption of one or more resources hosting the specific service instance;

computer program instructions for repeatedly monitoring and determining hot service instance workloads being run on the resources in the data center, the hot service instance workloads having a WEI higher than a predetermined first threshold WEI;

computer program instructions for repeatedly monitoring and determining cold service instance workloads being run on the resources in the data center, the cold service instance workloads having a WEI lower than a predetermined second threshold WEI;

computer program instructions for determining a relocation trigger event in dependence of the first and second threshold temperatures and the first and second threshold WEIs, the event having the functional meaning that a relocation of one or more service instance workloads is useful for lowering the temperature of a resource location and computer program instructions for initiating at least one of: a relocation of a hot service instance workload to a cold location, and a relocation of a cold service instance workload to a hot location, wherein relocation of a service instance workload does not exceed the maximum available resources of the location to which the service instance workload is relocated, the relocation initiated in response to an occurrence of the relocation trigger event.

12. The system of claim 11, further comprising computer program instructions for offering a plurality of services to a plurality of subscribed service consumers in a dynamic fashion.

13. The system of claim 11, further comprising computer program instructions for allowing the created service instance to be re-assigned from one resource server to another resource server.

14. The system of claim 11, further comprising computer program instructions for subjecting a plurality of service instance workloads to a single WEI calculation, wherein the plurality of service instance workloads are relocated concurrently when a trigger event occurs.

15. The system of claim 11, further comprising computer program instructions for determining if one or more service instance workloads can be relocated from a first resource location to a second resource location if the first resource location is switched off and the second resource location is expected to stay below a predetermined useful power consumption level.

* * * * *